US006181128B1

(12) United States Patent
Schroeder

(10) Patent No.: US 6,181,128 B1
(45) Date of Patent: Jan. 30, 2001

(54) MAGNETIC BEAM FLOW SENSOR

(75) Inventor: Thaddeus Schroeder, Rochester Hills, MI (US)

(73) Assignee: General Motors Corporation, Detroit, MI (US)

(*) Notice: Under 35 U.S.C. 154(b), the term of this patent shall be extended for 0 days.

(21) Appl. No.: 09/162,076

(22) Filed: Sep. 28, 1998

(51) Int. Cl.[7] ............................... G01B 7/14; G01R 33/09

(52) U.S. Cl. ............................... 324/207.21; 324/207.24; 73/861.74

(58) Field of Search .......................... 324/207.2, 207.21, 324/207.23, 207.24, 252, 260; 338/32 R, 32 H; 73/514, 515, 516 R, 517 R, 518, 519, 861.73, 831.74, 861.75

(56) References Cited

U.S. PATENT DOCUMENTS

| | | | |
|---|---|---|---|
| 3,971,253 | * | 7/1976 | Hini et al. ........................... 73/861.74 |
| 4,625,565 | * | 12/1986 | Wada et al. ........................ 73/861.74 |
| 5,767,419 | * | 6/1998 | Hutchinson ........................ 73/861.74 |

OTHER PUBLICATIONS

Siemens Magnetic Sensors Data Book, "Differential Magnetoresistive Sensor", 1989, pp. 107, 110.

* cited by examiner

Primary Examiner—Jay Patidar
(74) Attorney, Agent, or Firm—Margaret A. Dobrowitsky

(57) ABSTRACT

A magnetic sensor for measuring a physical property that can be translated into the flexing of a beam. The sensor includes a support extending outward from a base to a distal portion. A beam is fixed to the distal portion and extends inward therefrom to a free end of the beam adjacent the base. A pair of matched magnetic sensing elements are mounted on the base adjacent the free end of the beam which is nominally centered between the sensing elements. A magnetic field means is disposed against the magnetic sensing elements and at the free end of the beam. The free end of the beam is resiliently connected with the base through the beam and the support whereby force applied against the beam may move the free end closer to one and further from the other of the sensing elements. A differential signal is generated between the sensing elements by connecting a driving means to the sensing elements. The differential signal indicates the various positions of the free end of the beam. The positions of the free end can be used to determine various characteristics of the applied force.

12 Claims, 2 Drawing Sheets

MAGNETIC BEAM FLOW SENSOR

TECHNICAL FIELD

This invention relates to magnetic sensors, and more particularly to a magnetic sensor for measuring a physical property that can be translated into the flexing of a beam.

BACKGROUND OF THE INVENTION

It is known in the art relating to sensors to provide a sensor that can convert small distances traveled by a body across the sensor into a proportional electrical signal. One possible application for such a sensor is a flowmeter. Such sensors could be used in automotive applications to sense liquid or gas flow, e.g. air mass flow within an automotive fuel system to determine the flow rate of intake air to an engine.

In the past, flow sensors have often been in the form of hot wire devices, pressure sensing devices and turbine devices. Such sensors can be complicated in construction, relatively expensive, require complicated electronic circuits for developing linear output signals and many of them are incapable of determining flow direction.

SUMMARY OF THE INVENTION

The present invention provides a simple, very sensitive and low cost magnetic sensor suitable for a variety of applications where a physical property can be translated into the flexing of a beam. The sensor includes a support which extends outward from a base to a distal portion. A beam is fixed to the distal portion and extends inward therefrom to a free end of the beam adjacent the base.

A pair of matched magnetic sensing elements are mounted on the base adjacent and opposing the free end of the beam which is nominally centered between the sensing elements. A magnetic field means is disposed against the magnetic sensing elements and at the free end of the beam. Magnetic field means may be provided by a biasing magnet coupled with a high permeability material.

The free end of the beam is resiliently connected with the base through the beam and the support whereby force applied against the beam may move the free end closer to one and further from the other of the sensing elements. A differential signal is generated between the sensing elements by connecting a driving means to the sensing elements. The differential signal indicates the various positions of the free end of the beam for conversion to operational data.

In preferred embodiments, the sensing elements are magnetoresistors made from indium antimonide. When a force is applied to the beam, the beam moves closer to one magnetoresistor and the resistance in that magnetoresistor increases while the resistance in the other decreases. The voltage outputs across each magnetoresistor follow a similar pattern as the resistance of each magnetoresistor. A differential signal between the voltage outputs across the magnetoresistors and the distance traveled by the beam will have a linear relationship within known dimensional limits. The linear output can be used to determine various characteristics of the force applied to the beam.

These and other features and advantages of the invention will be more fully understood from the following description of certain specific embodiments of the invention taken together with the accompanying drawings.

DESCRIPTION OF THE PREFERRED EMBODIMENT

Figure 1:
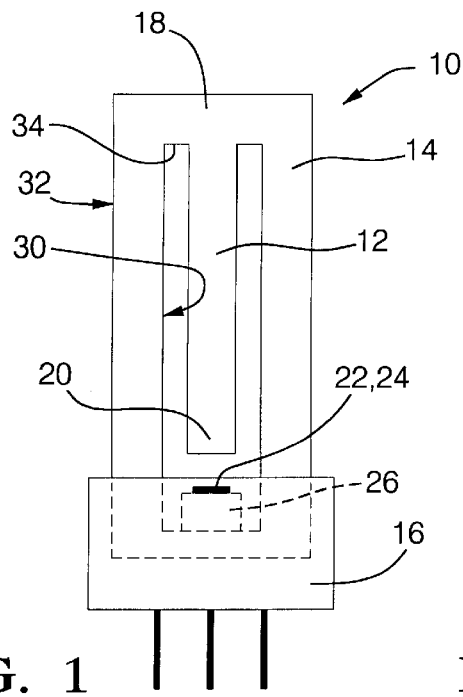
FIG. 1 is a front view of a magnetic sensor in accordance with the present invention.
Figure 2:
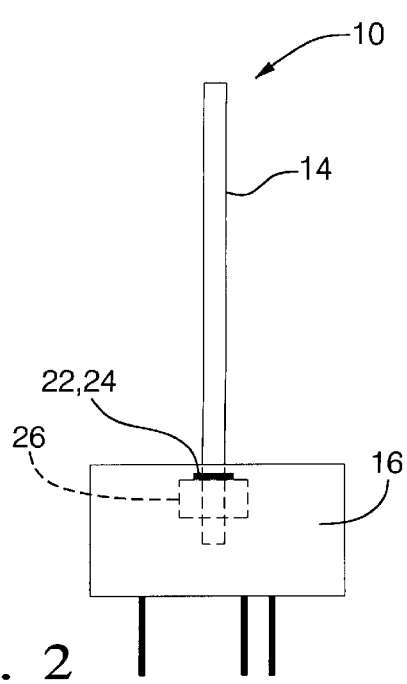
FIG. 2 is a side view of the magnetic sensor of FIG. 1.

Referring now to FIGS. 1 and 2 of the drawings in detail, numeral 10 generally indicates a magnetic sensor for sensing the movement of a beam 12. Sensor 10 includes a support 14 extending outward from a base 16 to a distal portion 18. Beam 12 is fixed to the distal portion 18 and extends inward therefrom to a free end 20 adjacent the base 16. The length of the beam 12 can vary from zero to a maximum length which is limited by the packaging of the sensor.

Two magnetic sensing elements 22, 24 are mounted on the base 16. The sensing elements 22, 24 operate by sensing the strength of an ambient magnetic field. The ambient magnetic field is provided by magnetic field means which provide a high concentration of magnetic flux in the area of the sensing elements. A magnet coupled with a relatively movable high permeability material provides the magnetic field means. The magnet is the source of the magnetic flux and the high permeability material concentrates the flux lines in the area of the sensing elements. If the movable body being sensed is not magnetized, or does not contain a magnet, the magnetic sensing elements 22, 24 are mounted on a biasing magnet 26 and at least the free end of the beam 20 is made from ferromagnetic (high permeability) material. Alternatively, the movable body may be magnetized by positioning the biasing magnet 26 on the free end 20 of the beam and mounting the magnetic sensing elements 22, 24 in close proximity to the free end of the beam. Preferably, the magnetic sensing elements are mounted on ferromagnetic material.

Figure 4:
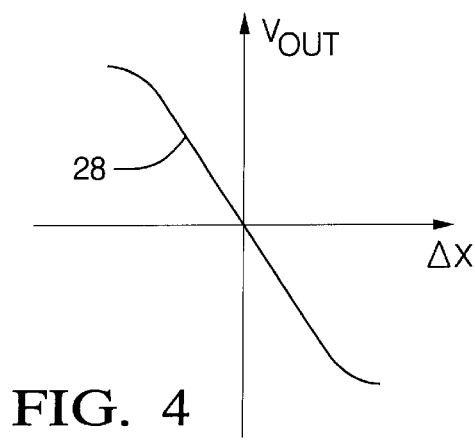
FIG. 4 is a graph of a differential signal between voltage outputs of the two sensing elements.

The proper spacing between the sensing elements 22, 24 is determined by determining the anticipated maximum flex displacement of the free end of the beam 12 for a particular application. The spacing desirably results in a substantially linear relationship between a differential signal ($V_{out}$) 28 between voltage outputs of the sensing elements 22, 24 and the distance moved within the range of displacement of the beam 12. The desired linear relationship of signal 28 is illustrated in FIG. 4. The linear relationship is used to determine characteristics of the force applied against the beam.

In a preferred embodiment of the invention, the support 14 is a substantially rectangular frame. The frame 14 is preferably made from a ferromagnetic material. Alternatively, the frame may be made from a thermostatic material which provides temperature compensation. The frame 14 has inner and outer edges 30, 32. The beam 12 extends from a distal end 34 of the inner edge 30 of the frame 14 to a free end 20 of the beam adjacent to and opposing the sensing elements 22, 24. The thicknesses of the beam 12 and the frame 14 are relatively thinner than their widths, allowing them to flex along a line parallel to the spacing of the sensing elements 22, 24. Alternatively, any suitable type of support could be utilized to accomplish the desired purpose of allowing a beam to flex in response to an applied force.

Figure 5:
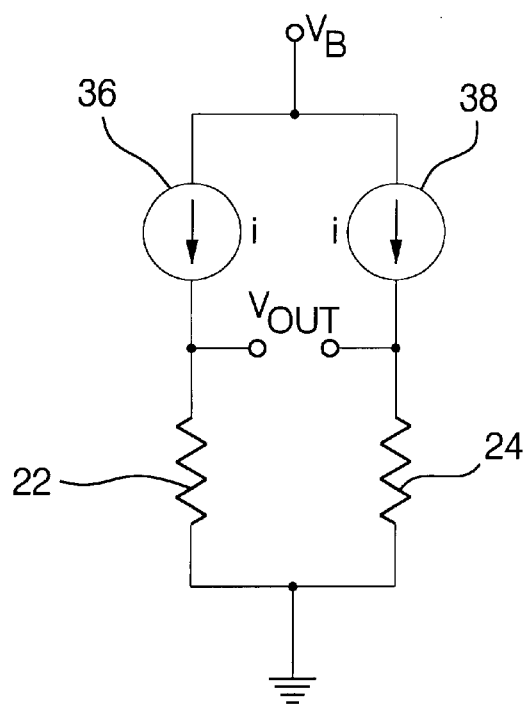
FIG. 5 is a schematic diagram of a current source drive circuit for driving the two sensing elements.
Figure 6:
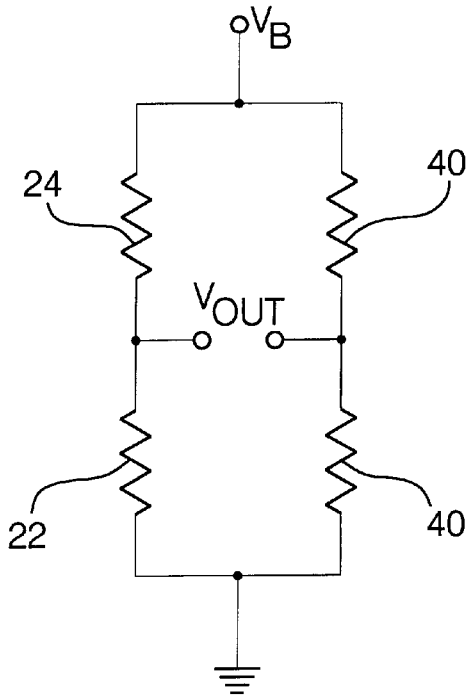
FIG. 6 is a schematic diagram of a voltage source drive circuit for driving the two sensing elements.

The magnetic sensing elements 22, 24 are magnetoresistors and are mounted on a biasing magnet 26. The biasing magnet 26 is mounted on a fixed end of the frame 14 opposite from the distal end 34. The magnetoresistors 22, 24 are made from indium antimonide (InSb). By using InSb magnetoresistors, output signal sensitivities of substantially 2 mV per 1 μm of the free end travel can be obtained. The magnetoresistors 22, 24 may be driven by two matched constant current sources 36, 38, as shown in FIG. 5. By applying the current sources 36, 38 to the magnetoresistors 22, 24, respectively, the voltage across the magnetoresistors 22, 24 will vary in accordance with their varying resistance. Alternatively, a voltage source having resistors 40 of equal value may be used to drive the magnetoresistors 22, 24, shown in FIG. 6.

The base 16 of the sensor is formed by overmolding the fixed end of the frame 14 which includes the biasing magnet 26 and the magnetoresistors 22, 24. By leaving the rest of the frame 14 and the beam 12 exposed, sensitivity is increased and dynamic response of the beam 12 is faster. Alternatively, the whole frame 14 can be overmolded with an internal cavity allowing for beam 12 movement. The type of base used depends on the specific application for the sensor. In a second alternative, the base and the frame are formed by overmolding an end of the beam opposite the free end of the beam.

Figure 3:
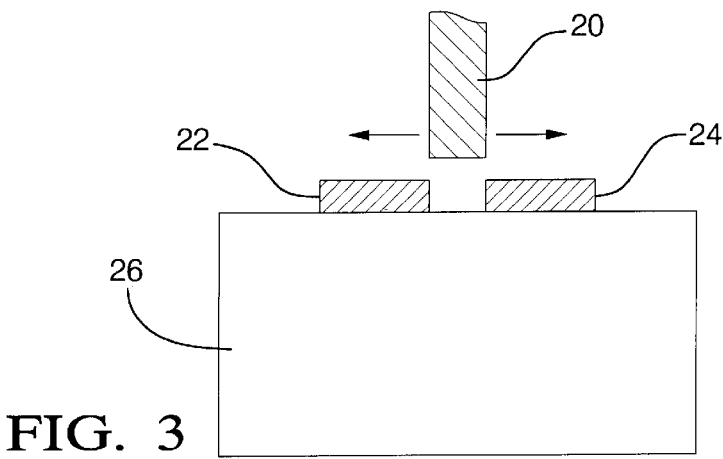
FIG. 3 is a side view of a beam, two sensing elements and a biasing magnet of the magnetic sensor in FIGS. 1 and 2, illustrating the movement of the beam in response to a force.

In operation, the beam 12 moves between a flexed position and a non-flexed position. In the non-flexed or nominal position, the beam 12 is positioned precisely between the two magnetoresistors 22, 24, as illustrated in FIG. 3. In this position, a differential signal 28 between the voltage outputs across the magnetoresistors 22, 24 is equal to zero.

When there is a force applied to the beam 12, it flexes towards one of the magnetoresistors 22, 24, depending on the direction of the force. When the beam 12 is closer to one of the magnetoresistors than the other, the magnetic field distribution through the magnetoresistors 22, 24 is disturbed, increasing the resistance of the magnetoresistor closest to the beam 12 and decreasing the resistance of the other magnetoresistor. The voltage outputs across the magnetoresistors follow a similar pattern as the resistance of each magnetoresistor. Thus, the differential signal 28 will increase or decrease depending on the direction of the force.

The polarity of the differential signal 28 indicates the direction of the force. For example, if the differential signal 28 is negative, the direction of force is towards magnetoresistor 22. If the differential signal 28 is positive, the direction of force is towards magnetoresistor 24. The differential signal 28 has a linear output that can be used to determine characteristics of the applied force.

In the embodiment of FIGS. 1–3, both the beam 12 and the support 14 flex when a force is applied, such as from fluid flow impinging on the beam 14. In a first alternative embodiment, the support 14 may be made rigid, as by overmolding the complete frame 14, so that only the beam 12 flexes. The beam may be stiffened, such as by forming a rib extending along its length.

Manufacturing of the sensor includes the following steps. Two matched magnetoresistors are attached to a biasing magnet. The magnetoresistors are either on a single die or on two separate dies. The magnet/magnetoresistor assembly is mounted on a frame with provision made for electrical contact between the magnetoresistors and external terminals of the sensor. The frame may be made unitary with a beam from relatively thin and resilient ferromagnetic material, such as steel. The portion of the frame where the magnet and magnetoresistors are mounted is placed in a mold cavity and overmolded. Finally, the magnet is magnetized.

While the invention has been described by reference to certain preferred embodiments, it should be understood that numerous changes could be made within the spirit and scope of the inventive concepts described. Accordingly it is intended that the invention not be limited to the disclosed embodiments, but that it have the fall scope permitted by the language of the following claims.

What is claimed is:

1. A magnetic sensor comprising:

a support extending outward from a base to a distal portion;

a beam fixed to the distal portion and extending inward therefrom to a free end of the beam adjacent the base;

a pair of matched magnetic sensing elements carried by the base and spaced one from the other by a predetermined distance, the base and elements being fixed in spaced adjacency opposing the free end of the beam such that the free end of the beam occupies a substantially equidistant, nominal position relative to both elements;

magnetic field means disposed against the magnetic sensing elements and at the free end of the beam; and said free end of the beam being connected with the base through the beam and the support whereby force applied against the beam causes resilient displacement of the free end from the nominal position; and driving means coupled to the sensing elements such that a differential signal is generated between the sensing elements indicating the various positions of the free end of the beam for conversion to operational data.

2. A magnetic sensor as in claim 1, wherein the support is resilient allowing the free end of the beam to displace from the nominal position in response to an applied force.

3. A magnetic sensor as in claim 1, wherein the support is relatively rigid and the beam is relatively resilient allowing the free end of the beam to displace from the nominal position in response to an applied force.

4. A magnetic sensor as in claim 1, wherein the support and the beam are resilient allowing the free end of the beam to displace from the nominal position in response to an applied force.

5. A magnetic sensor as in claim 1, wherein the magnetic field means comprises a biasing magnet generally beneath the magnetic sensing elements opposite the free end of the beam and a ferromagnetic material located at the free end of the beam.

6. A magnetic sensor as in claim 1, wherein the magnetic field means comprises a biasing magnet located at the free end of the beam.

7. A magnetic sensor as in claim 1, wherein the support is a substantially rectangular frame having two spaced sides bridged by said distal portion.

8. A magnetic sensor as in claim 1, wherein the support is a substantially rectangular frame partially covered by the base.

9. A magnetic sensor as in claim 8, wherein the magnetic sensing elements are mounted on the frame adjacent the free end of the beam.

10. A magnetic sensor as in claim 1, wherein the magnetic sensing elements are magnetoresistors.

11. A magnetic sensor as in claim 10, wherein the magnetoresistors are made from indium antimonide.

12. A magnetic sensor as in claim 1 further comprising: driving means coupled to the sensing elements such that a differential signal is generated between the sensing elements indicating the various positions of the free end of the beam for conversion to operational data.

* * * * *